US006995957B2

(12) United States Patent
Jayasekara

(10) Patent No.: US 6,995,957 B2
(45) Date of Patent: Feb. 7, 2006

(54) MAGNETORESISTIVE SENSOR HAVING A HIGH RESISTANCE SOFT MAGNETIC LAYER BETWEEN SENSOR STACK AND SHIELD

(75) Inventor: Wipul P. Jayasekara, Los Gatos, CA (US)

(73) Assignee: Hitachi Global Storage Technologies Netherland B.V., Amsterdam (NL)

( * ) Notice: Subject to any disclaimer, the term of this patent is extended or adjusted under 35 U.S.C. 154(b) by 289 days.

(21) Appl. No.: 10/393,336

(22) Filed: Mar. 18, 2003

(65) Prior Publication Data

US 2004/0184196 A1    Sep. 23, 2004

(51) Int. Cl.
*G11B 5/39* (2006.01)
(52) U.S. Cl. .................................... 360/319
(58) Field of Classification Search ................ 360/319, 360/320
See application file for complete search history.

(56) References Cited

U.S. PATENT DOCUMENTS

| | | | | |
|---|---|---|---|---|
| 5,739,987 | A | 4/1998 | Yuan et al. ................. | 360/113 |
| 5,894,384 | A | 4/1999 | Funayama et al. .......... | 360/113 |
| 6,078,484 | A | 6/2000 | Sakakima ................... | 360/324 |
| 6,223,420 | B1 * | 5/2001 | Lee et al. ................... | 360/321 |
| 6,317,301 | B2 * | 11/2001 | Narumi et al. ......... | 360/327.32 |
| 6,765,768 | B2 * | 7/2004 | Saito .......................... | 360/319 |
| 6,785,099 | B2 * | 8/2004 | Lee et al. ................... | 360/319 |
| 2002/0034055 | A1 | 3/2002 | Seyama et al. ........ | 360/324.11 |
| 2002/0075609 | A1 * | 6/2002 | Terunuma .................... | 360/319 |

FOREIGN PATENT DOCUMENTS

| | | |
|---|---|---|
| JP | 10222814 A2 | 8/1998 |
| JP | 10275314 A2 | 10/1998 |
| JP | 11-54325 | 2/1999 |
| JP | 11213345 A2 | 8/1999 |
| JP | 2000090417 A | 3/2000 |
| JP | 2001134910A 2 | 5/2001 |
| JP | 2001256619 A | 9/2001 |

OTHER PUBLICATIONS

Kano, H. et al., "Sensor Design of Vertical Type GMR Head", IEEE Trans. Magn. (USA) vol. 36, No. 5, pt. 1, Sep. 2000 P2596-8.
Russek et al., "High Frequency Measurements of CoFeHfO Thin Films" IEEE Trans. Magn. (USA) vol. 37, No. 4, pt. 1,Jul. 2001 P2248-50.
Huijbregtse et al.,"High Frequency Permeability of Soft Magnetic Fe-Hf-O Films With High Resistivity" J.Appl. Phys. (USA) vol. 83, No. 3, Feb. 1, 1998 P1569-74.

* cited by examiner

*Primary Examiner*—Craig A. Renner
(74) *Attorney, Agent, or Firm*—Zilka-Kotab, PC

(57) ABSTRACT

A magnetoresistive sensor has a high resistance soft magnetic layer disposed between the sensor stack and at least one magnetic shield. The presence of the high resistance soft magnetic layer allows a smaller magnetic read gap to be achieved which results in higher recording density. The susceptibility of the magnetoresistive sensor to defects and electrostatic damage is improved. A disk drive is provided having the novel magnetoresistive sensor.

13 Claims, 4 Drawing Sheets

MAGNETORESISTIVE SENSOR HAVING A HIGH RESISTANCE SOFT MAGNETIC LAYER BETWEEN SENSOR STACK AND SHIELD

BACKGROUND OF THE INVENTION

1. Field of the Invention

The invention relates to a magnetoresistive sensor, typically used in a magnetic disk drive; and, more specifically, to a magnetoresistive sensor having a high resistance soft magnetic layer in the gap.

2. Description of the Background Art

Disk drives using magnetic recording of digital information store most of the data in contemporary computer systems. A disk drive has at least one rotating disk with discrete concentric tracks of data. Each disk drive also has at least one recording head which typically has a separate write element and read element for writing and reading the data on the tracks. The recording head is constructed on a slider and the slider is attached to a suspension. The combination of the recording head, slider, and suspension is called a head gimbal assembly. In addition, there is an actuator which positions the recording head over a specific track of interest. The actuator first rotates to seek the track of interest. After positioning the recording head over the track, the actuator maintains the recording head in close registration to that track. The disk in a disk drive has a substrate and a magnetic layer formed over the substrate for magnetic recording. The slider carrying the recording head has a disk facing surface upon which an air bearing is constructed. The air bearing allows the slider to float on a cushion of air and to be positioned close to the disk surface. Alternatively, the slider surface facing the disk can be adapted for partial or continuous contact with the disk.

A magnetoresistive sensor is used as the read element in most contemporary disk drives. A magnetoresistive sensor, most commonly a magnetoresistive spin valve sensor, is a sandwich of layers including a ferromagnetic pinned layer, a nonmagnetic electrically conducting layer, and a ferromagnetic free layer. The sandwich of layers is also called the sensor stack. The sensor stack is disposed between two magnetic shields. There is a thin insulating layer between the sensor stack and each magnetic shield. The distance between the magnetic shields is the magnetic read gap. The resistance of the magnetoresistive sensor is responsive to the direction and magnitude of an applied magnetic field such as the field from a written magnetic transition on a disk. Sense current is passed through the sensor to detect the change in resistance.

A higher areal density of recorded information is typically required for each new generation of disk drives. The size of the geometrical features of the read sensor must be reduced to be commensurate with the smaller bit sizes needed. One geometrical feature which is critical to the achievement of higher recorded density is the size of the magnetic read gap. It is difficult to reduce the thickness of the sensor stack without degrading magnetic performance. Therefore the read gap has typically been reduced by reducing the thickness of the thin insulating layers. However, the required thickness of an insulating layer is now so thin that the read elements are very susceptible to electrostatic damage and minor defects such as pin holes in the thin insulating layer. A defective or damaged insulating layer between the sensor stack and the magnetic shields may allow sense current to pass through the magnetic shield thus causing significant degradation in the performance of the sensor.

Thus what is needed is a magnetoresistive sensor that has a very small read gap and that is also insensitive to defects or electrostatic damage.

SUMMARY OF THE INVENTION

A preferred embodiment of the invention provides a magnetic read element having a layer of high resistance soft magnetic material disposed between at least one of the insulating layers and a magnetic shield. The high resistance soft magnetic layer preferably has a composition of A-B-C where A is selected from the group Fe and Co, B is selected from the group Hf, Y, Ta, and Zr, and C is selected from the group of O and N. The high resistance soft magnetic layer may also be formed from CoFeHfO. A magnetic read element according to the invention provides a narrow magnetic read gap enabling high density magnetic recording while remaining insensitive to electrostatic damage and defects. In another embodiment of the invention, a disk drive is provided having a read element including a high resistance soft magnetic layer disposed between at least one insulating layer and a magnetic shield.

Other aspects and advantages of the invention will become apparent from the following detailed description, which, when taken in conjunction with the drawings, illustrate by way of example the principles of the invention.

DETAILED DESCRIPTION OF THE INVENTION

A preferred embodiment of the invention provides a magnetic read element having a high resistance soft magnetic layer disposed between at least one of the insulating layers and a magnetic shield. The high resistance soft magnetic layer allows the magnetic read gap to be reduced without increasing the read element susceptibility to electrostatic damage and defects. In another embodiment of the invention, a disk drive has a read element including a high resistance soft magnetic layer disposed between at least one insulating layer and a magnetic shield.

Figure 1:
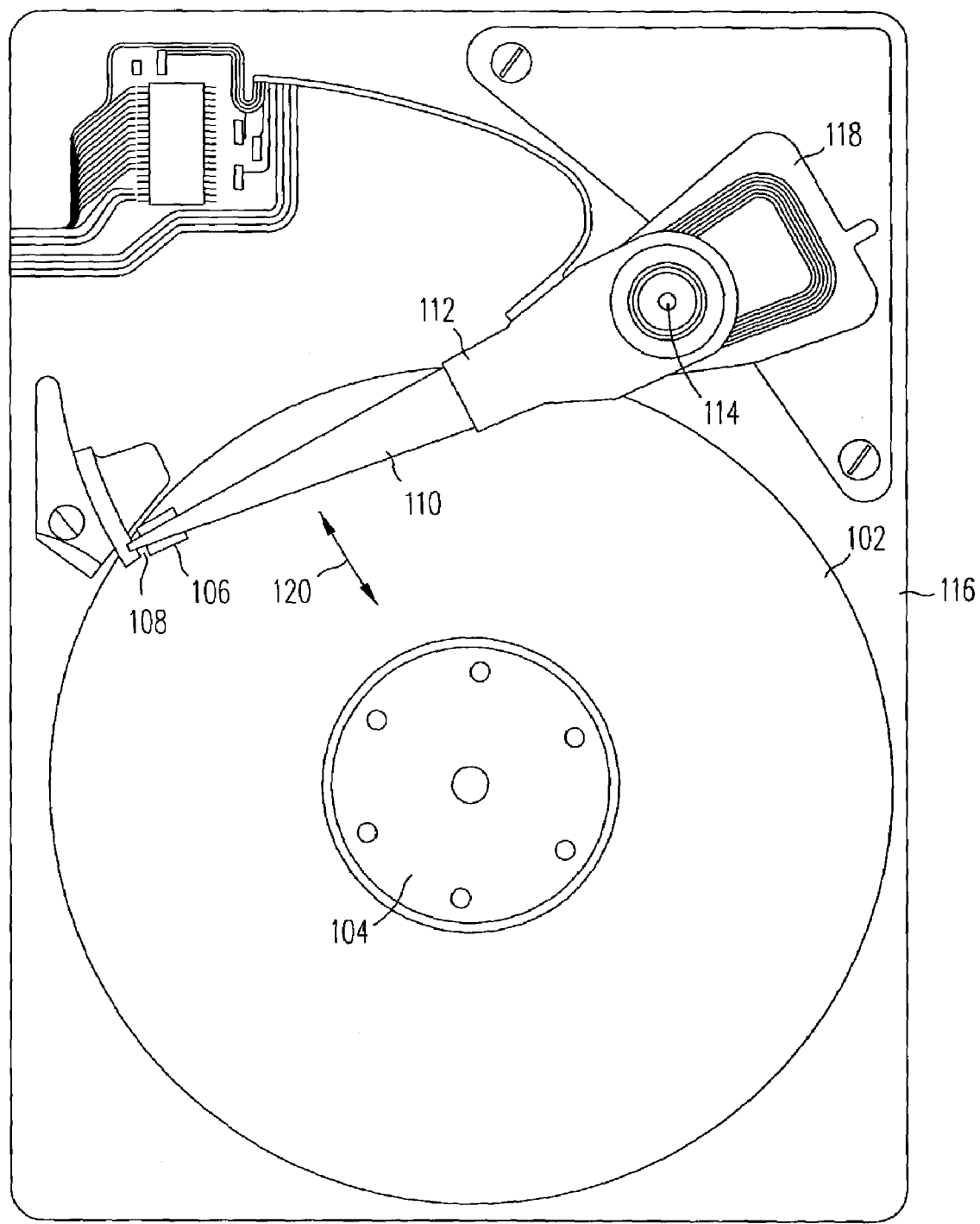
FIG. 1 illustrates a view of a disk drive including a read element according to the present invention.

Referring to FIG. 1, a magnetic disk drive 100 has at least one rotatable magnetic disk 102 supported by a spindle 104 and rotated by a motor (not shown). There is at least one slider 106 with an attached recording head 108 positioned over the disk 102 surface while reading and writing. The recording head 108 includes a write element for writing data onto the disk 102. The recording head also includes a magnetoresistive sensor according to the present invention (shown in detail below) used as a read element for reading data from the disk. The magnetoresistive sensor is responsive to an external magnetic field such as the field from a written transition on the magnetic disk 102. The slider 106 is attached to a suspension 110 and the suspension 110 is attached to an actuator 112. The actuator 112 is pivotally attached 114 to the housing 116 of the disk drive 100 and is pivoted by a voice coil motor 118. As the disk rotates, the actuator 112 positions the slider 106 along with the suspension 110 along a radial arcuate path 120 over the disk 102 surface to access a data track of interest.

Again referring to FIG. 1, during operation of the disk drive 100, the motion of the rotating disk 102 relative to the slider 106 generates an air bearing between the slider 106 and the disk 102 which exerts an upward force on the slider 106. This upward force is balanced by a spring force from the suspension 110 urging the slider 106 toward the surface of the disk 102. Alternatively, the slider 106 may be in either partial or continuous contact with the disk 102 surface during operation.

Figure 2:
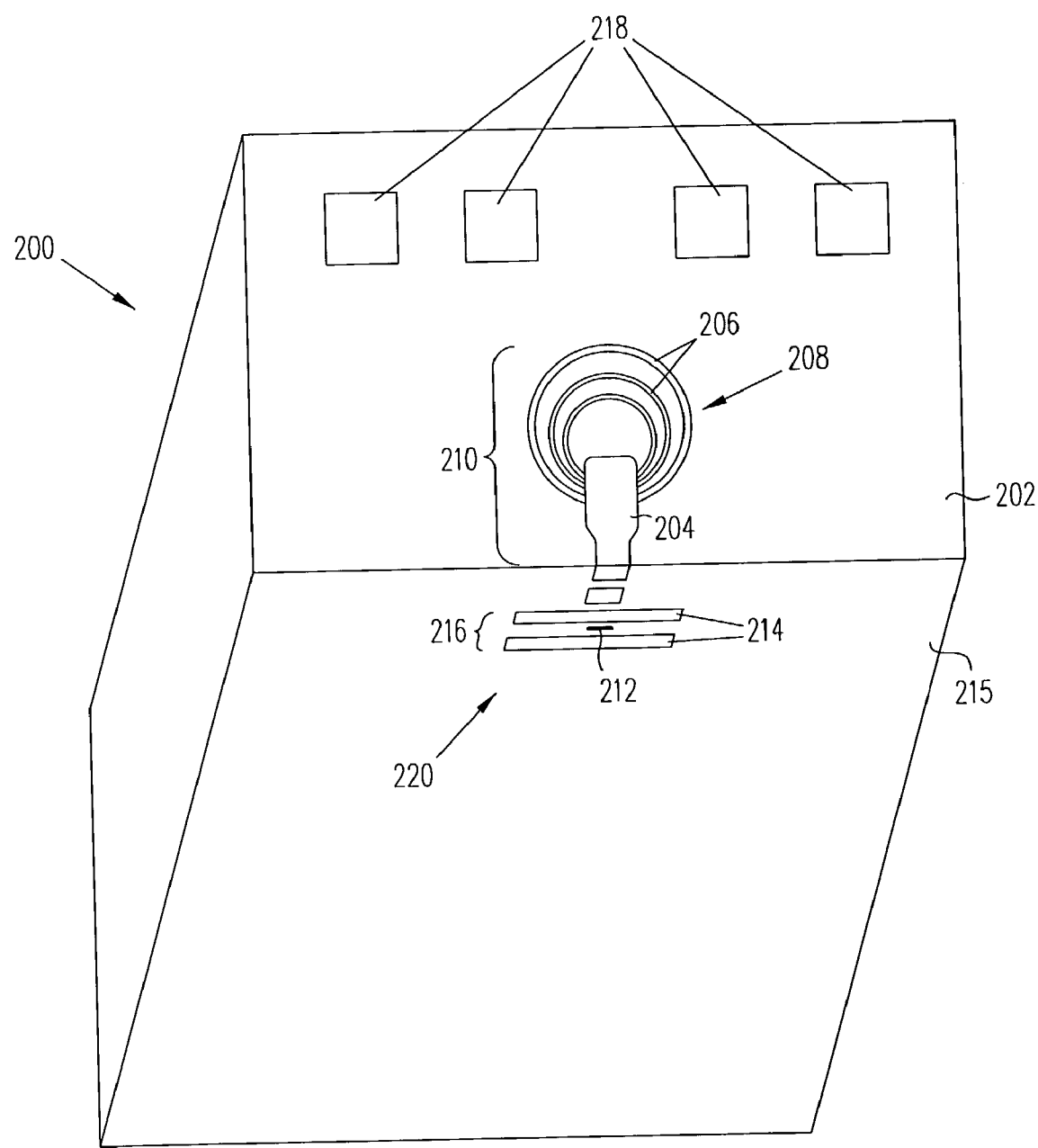
FIG. 2 illustrates a perspective view of a slider and recording head.

FIG. 2 illustrates a more detailed view of a slider 200. The recording head 220 is typically constructed on the trailing surface 202 of the slider 200. FIG. 2 illustrates the upper pole 204 and the turns 206 of the coil 208 of the write element 210 of the recording head 220. The read sensor 212 is disposed between the slider 200 and the write element 210. The most active portion of the read sensor 212 is revealed on the disk facing surface 215 of the slider 200. The read sensor 212 is also disposed between two magnetic shields 214. The magnetic shields 214 are typically formed from a nickel-iron alloy. The magnetic shields 214, the read sensor 212, and any intervening layers comprise the read element 216. The electrical connection pads 218 which allow connection with the write element 210 and read element 216 are illustrated.

Figure 3:
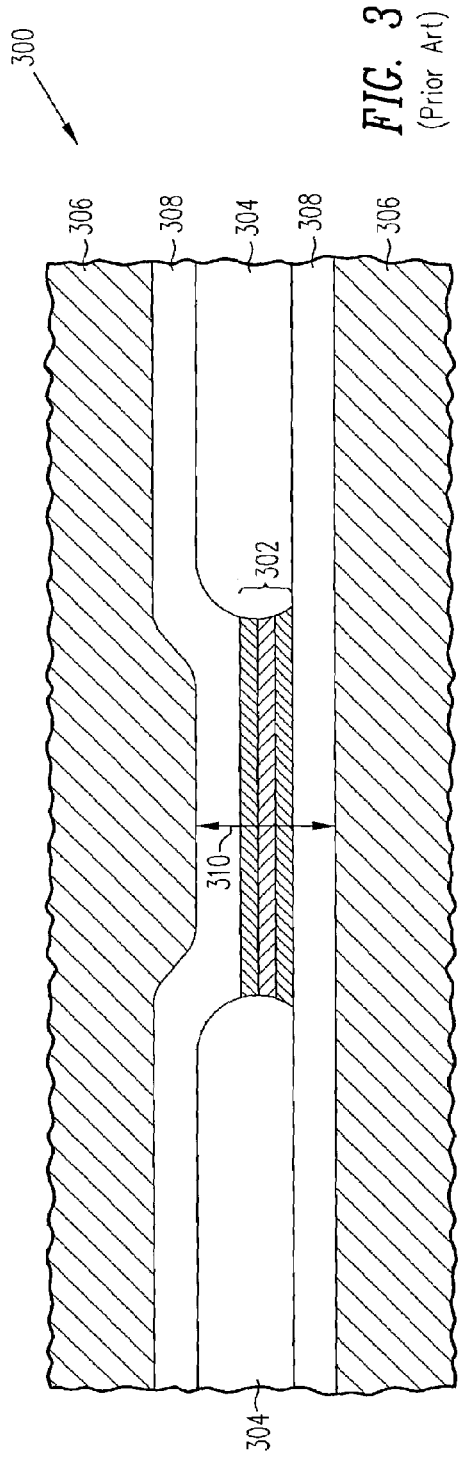
FIG. 3 illustrates a disk facing view of a magnetoresistive sensor according to the prior art.

FIG. 3 illustrates an enlarged view of a read element 300 according to the prior art. The multiple layers in the sensor stack 302 are typically abutted with magnetic hard bias and lead structures 304. The sensor stack 302 is disposed between two magnetic shields 306. There are two insulating layers 308, typically formed from alumina, silicon oxide, silicon nitride, tantalum oxide, or the like, which insulate the sensor stack 302 from each of the magnetic shields 306. The magnetic read gap 310 is the distance between the two magnetic shields 306 in the vicinity of the sensor stack 302. As mentioned previously, in order to support higher recorded densities, the read gap 310 must be reduced. The sensor stack 302 cannot be significantly reduced in thickness without degrading sensor performance. Therefore, the thickness of the insulating layers 308 have been progressively reduced. A typical thickness of an insulating layer is less than 200 Angstroms and in the near future will be required to become much thinner. However the insulating layers 308 are now so thin that uniformity, susceptibility to minor defects, and the ability to withstand electrostatic damage are becoming significant problems.

Figure 4A:
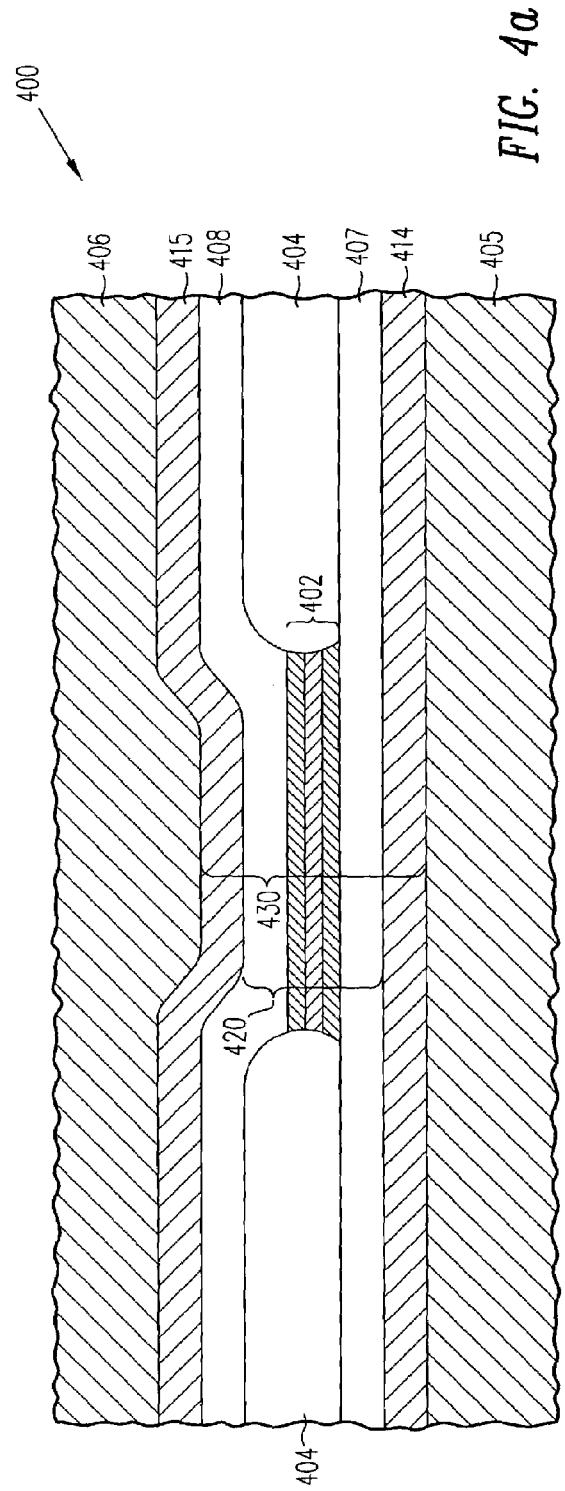
FIG. 4a illustrates a disk facing view of a magnetoresistive sensor having high resistance soft magnetic layers disposed between each of the insulating layers and the magnetic shields.

FIG. 4a illustrates an embodiment of a read element 400 according to the present invention. The read element 400 includes a sensor stack 402 with abutted hard bias and lead structures 404. The sensor stack 402 is disposed between two magnetic shields 405, 406 and there are insulating layers 407, 408 disposed between the sensor stack 402 and the magnetic shields 405, 406. The insulating layers 407, 408 are typically formed from alumina, silicon oxide, silicon nitride, tantalum oxide, or the like. The magnetic shields 405, 406 are typically formed from a nickel-iron alloy such as permalloy. The read element 400 includes two layers 414, 415 of high resistance soft magnetic material disposed between each of the insulating layers 407, 408 and the magnetic shields 405, 406.

Figure 4B:
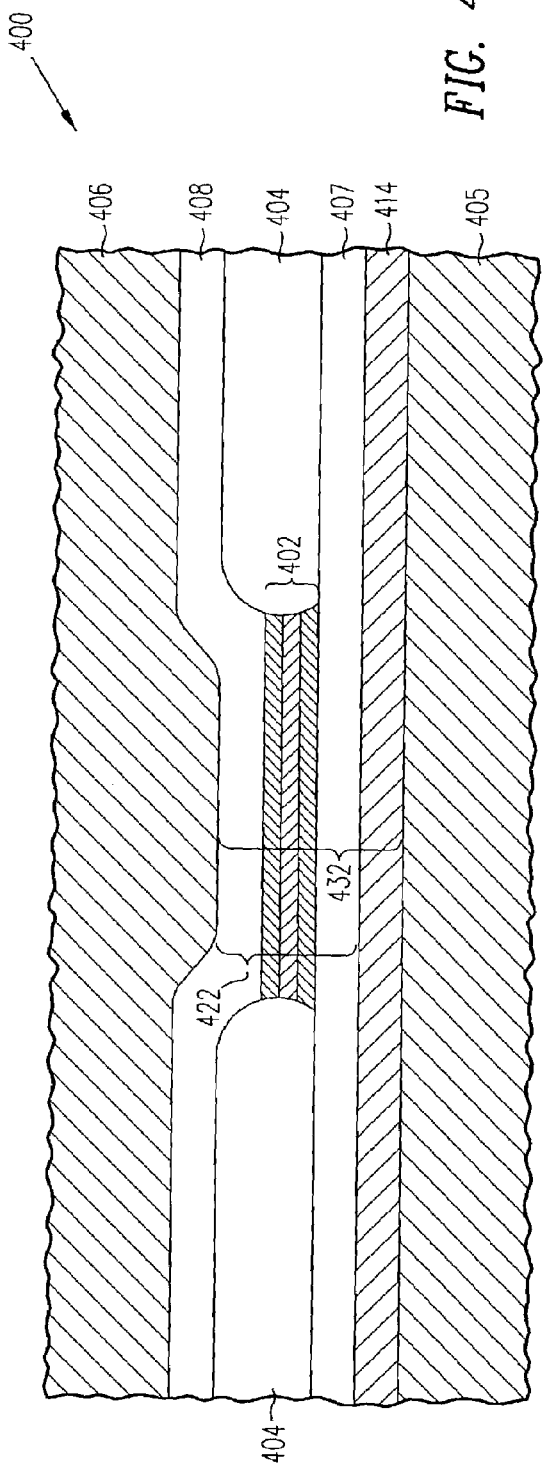
FIG. 4b illustrates a disk facing view of a magnetoresistive sensor having a high resistance soft magnetic layer disposed between a bottom insulating layer and a bottom magnetic shield; and, FIG. 4c illustrates a disk facing view of a magnetoresistive sensor having a high resistance soft magnetic layer disposed between a top insulating layer and a top magnetic shield.

FIG. 4b illustrates another embodiment of the present invention. The read element 400 includes a sensor stack 402 with abutted hard bias and lead structures 404. The sensor stack 402 is disposed between two magnetic shields 405, 406 and there are insulating layers 407, 408 disposed between the sensor stack 402 and each of the magnetic shields 405, 406. The read element 400 includes a layer 414 of high resistance soft magnetic material disposed between the bottom insulating layer 407 and the bottom magnetic shield 405.

Figure 4C:
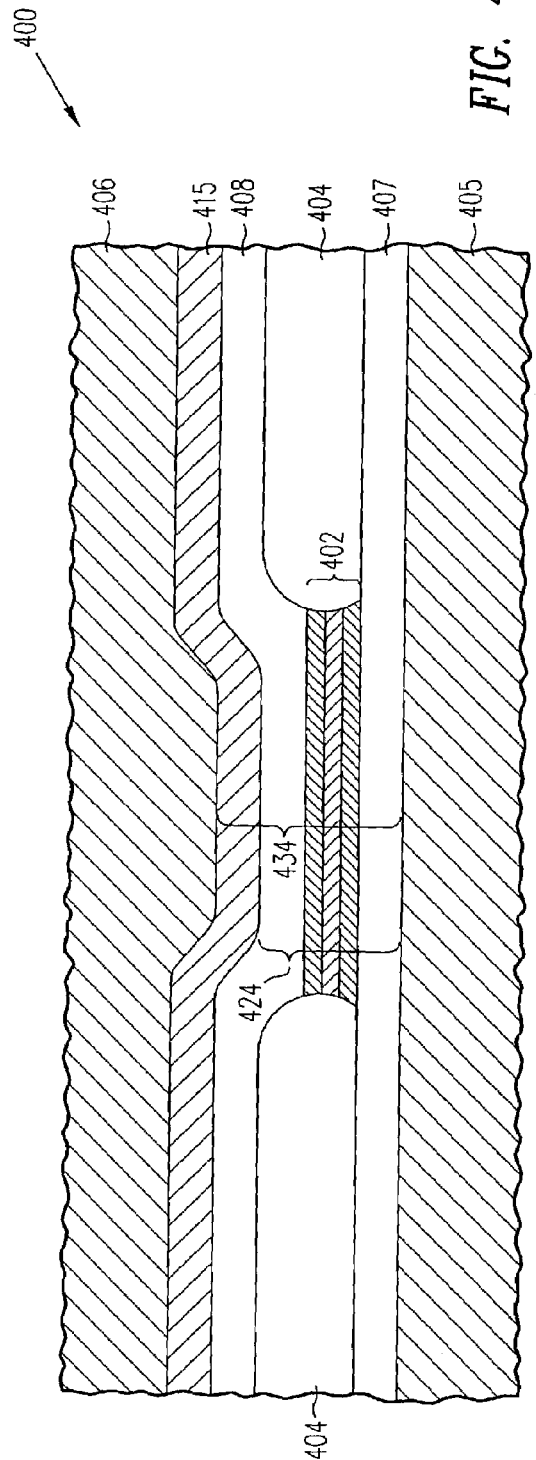

FIG. 4c illustrates a third embodiment of the present invention. The read element 400 includes a sensor stack 402 with abutted hard bias and lead structures 404. The sensor stack 402 is disposed between two magnetic shields 405, 406 and there are insulating layers 407, 408 disposed between the sensor stack 402 and each of the magnetic shields 405, 406. The read element 400 includes a layer 415 of high resistance soft magnetic material disposed between the top insulating layer 408 and the top magnetic shield 406.

Preferably, the resistivity of the high resistance soft magnetic material is high enough to significantly retard current through the material. The resistivity is preferably greater than about 2000 micro-ohm-cm. In addition, the magnetic moment of the high resistance soft magnetic material is preferably high enough such that the material functions as a magnetic shield without magnetically saturating. The magnetic moment of the high resistance soft magnetic material is preferably greater than about 80 emu/cc. The material preferably has a permeability greater than about 200 to function well as a magnetic shield. Finally, the high resistance magnetic material should be magnetically soft preferably having a coercivity less than about 10 Oe.

There are several materials which meet these criterion. The composition of effective materials is conveniently represented by A-B-C where A is selected from the group of iron (Fe) and cobalt (Co), B is selected from the group of hafnium (Hf), yttrium (Y), tantalum (Ta) and zirconium (Zr), and C is selected from the group of oxygen (O) and nitrogen (N). Cobalt-iron-hafnium-oxygen (CoFeHfO) is also suitable. FeHfN is particularly suitable since the magnetic moment of FeHfN is higher than the moment of the conductive magnetic shields (405, 406 in FIGS. 4a, 4b and 4c). The magnetic shields are typically formed from permalloy (NiFe). FeHfN also has a resistivity about eight times higher than the permalloy in the magnetic shields.

The high resistance soft magnetic material may be deposited by any of well known methods such as sputtering. The stoichimetric composition of the high resistance magnetic materials does not appear to be critical and in general has about equal atomic ratios. The thickness of the high resistance magnetic layer is preferably in the range of about 0.07 microns to about 2 microns. The lower limit of this thickness range is partially established by the ability to form a thin layer relatively free of defects.

Referring to FIGS. 4a, 4b, and 4c, the presence of the high resistance soft magnetic material effectively creates two gaps in the read element 400. The first gap is the magnetic read gap which partly determines the areal density which may be supported by the read element. The magnetic read gap is the distance between the magnetically active portions of the shields disposed near the sensor stack. Thus, in FIG. 4a the magnetic read gap 420 is the distance between the two high resistance soft magnetic layers 414, 415. In FIG. 4*b* the magnetic read gap 422 is the distance between the high resistance soft magnetic layer 414 and the upper magnetic shield 406. In FIG. 4*c* the magnetic read gap 424 is the distance between the high resistance soft magnetic layer 415 and the lower magnetic shield 405. The second gap, the electrical gap, is the distance between the conductive magnetic shields. The electrical gap is indicated by element 430 in FIG. 4*a*, element 432 in FIG. 4*b*, and element 434 in FIG. 4*c*. The electrical gap is the electrically important distance which determines the ability of the read element 400 to withstand electrostatic damage. In general, as the electrical gap is increased the ability of the sensor to withstand electrostatic damage is improved.

Another advantage of using a layer of high resistance soft magnetic material in conjunction with a nonmagnetic thin insulating layer between a sensor stack and a magnetic shield is that a single small defect in either layer is unlikely to adversely affect the sensor. Since there are two layers which are either insulating or having high resistance between the sensor stack and the shields, the importance of small defects such as pin holes in either the insulating layers or the high resistance soft magnetic layers is greatly diminished.

A read element according to the present invention supports very high recording densities and additionally exhibits greatly improved resistance to defects and electrostatic damage. Although specific embodiments of the invention have been described and illustrated, the invention is not to be limited to the specific forms or arrangements thus described. For example, the present invention is also very useful when used with magnetoresistive sensors having exchanged coupled bias stabilization tabs rather than hard bias structures. Those skilled in the art will recognize other embodiments which fall within the scope of the invention.

I claim:

1. A magnetoresistive sensor, comprising:
   a magnetoresistive sensor stack responsive to an external magnetic field;
   first and second magnetic shields, wherein said magnetoresistive sensor stack is disposed between said first and second magnetic shields;
   a first insulating layer disposed between said magnetoresistive sensor stack and said first magnetic shield;
   a second insulating layer disposed between said magnetoresistive sensor stack and said second magnetic shield;
   a high resistance soft magnetic layer disposed between at least one of said insulating layers and one of said magnetic shields closest thereto;
   wherein said high resistance soft magnetic layer has a magnetic moment greater than about 80 emu/cc,
   wherein said high resistance soft magnetic layer has a composition of A-B-C where A is Co, B is selected from the group consisting of Hf, Y, Ta, and Zr, and C is N.

2. A magnetoresistive sensor as in claim 1 wherein a magnetic moment of each of the shields is less than the magnetic moment of the high resistance soft magnetic layer.

3. A magnetoresistive sensor as in claim 1 wherein said high resistance soft magnetic layer has a resistivity greater than 2000 micro-ohm-cm.

4. A magnetoresistive sensor as in claim 1 wherein said high resistance soft magnetic layer has a permeability greater than about 200.

5. A magnetoresistive sensor as in claim 1 wherein said high resistance soft magnetic layer has a thickness of about 0.07 microns to about 2 microns.

6. A magnetoresistive sensor as in claim 1 wherein at least one of said insulating layers comprises a material selected from the group consisting of alumina, silicon oxide, silicon nitride, and tantalum oxide.

7. A magnetoresistive sensor as in claim 1 wherein said high resistance soft magnetic layer has a magnetic moment that allows said high resistance soft magnetic layer to function as a magnetic shield without magnetically saturating.

8. A magnetoresistive sensor as in claim 1 wherein said high resistance soft magnetic layer has a coercivity of less than about 10 Oe.

9. A disk drive, comprising:
   a magnetic disk;
   a write head for writing information to said disk;
   a magnetoresistive sensor for reading information from said disk, wherein said magnetoresistive sensor includes:
   a magnetoresistive sensor stack responsive to an external magnetic field;
   first and second magnetic shields wherein said magnetoresistive sensor stack is disposed between said first and second magnetic shields;
   a first insulating layer disposed between said magnetoresistive sensor stack and said first magnetic shield;
   a second insulating layer disposed between said magnetoresistive sensor stack and said second magnetic shield; and,
   a high resistance soft magnetic layer disposed between at least one of said insulating layers and one of said magnetic shields closest thereto,
   wherein said high resistance soft magnetic layer has a composition of A-B-C where A is Co, B is selected from the group consisting of Hf, Y, Ta, and Zr, and C is N.

10. A disk drive as in claim 9 wherein said high resistance soft magnetic layer has a magnetic moment greater than about 80 emu/cc.

11. A disk drive as in claim 9 wherein said high resistance soft magnetic layer has a resistivity greater than about 2000 micro-ohm-cm.

12. A disk drive as in claim 9 wherein a permeability of said high resistance soft magnetic layer is greater than about 200.

13. A disk drive as in claim 9 wherein said first and second insulating layers comprise a material selected from the group consisting of alumina, silicon oxide, silicon nitride, and tantalum oxide.

* * * * *